(12) United States Patent
Thanu et al.

(10) Patent No.: US 11,652,018 B2
(45) Date of Patent: May 16, 2023

(54) HEAT SPREADER EDGE STANDOFFS FOR MANAGING BONDLINE THICKNESS IN MICROELECTRONIC PACKAGES

(71) Applicant: Intel Corporation, Santa Clara, CA (US)

(72) Inventors: Dinesh P. R. Thanu, Chandler, AZ (US); Hemanth K. Dhavaleswarapu, Tempe, AZ (US); John J. Beatty, Chandler, AZ (US); Syadwad Jain, Chandler, AZ (US); Nachiket R. Raravikar, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 17/343,565

(22) Filed: Jun. 9, 2021

(65) Prior Publication Data

US 2021/0305118 A1    Sep. 30, 2021

Related U.S. Application Data

(63) Continuation of application No. 15/689,463, filed on Aug. 29, 2017, now Pat. No. 11,062,970.

(51) Int. Cl.
*H01L 23/34* (2006.01)
*H01L 23/367* (2006.01)
(Continued)

(52) U.S. Cl.
CPC ........ *H01L 23/367* (2013.01); *H01L 23/3142* (2013.01); *H01L 23/3675* (2013.01);
(Continued)

(58) Field of Classification Search
CPC ............... H01L 23/3142; H01L 23/367; H01L 23/3675; H01L 23/49833
(Continued)

(56) References Cited

U.S. PATENT DOCUMENTS

| 5,291,064 A | 3/1994 | Kurokawa |
| 5,329,160 A | 7/1994 | Miura et al. |

(Continued)

FOREIGN PATENT DOCUMENTS

| JP | 2008244473 | 10/2008 |
| JP | 2011082345 | 4/2011 |

OTHER PUBLICATIONS

Extended European Search Report for European Patent Application No. 18186198.0, dated Feb. 4, 2019.
(Continued)

*Primary Examiner* — Nitin Parekh
(74) *Attorney, Agent, or Firm* — Essential Patents Group, LLP.

(57) ABSTRACT

A microelectronic package may be fabricated to include a microelectronic substrate, at least one microelectronic device attached to the microelectronic substrate, a heat dissipation device in thermal contact with at least one microelectronic device and having at least one projection attached to the microelectronic substrate, and at least one standoff extending from the at least one projection, wherein the at least one standoff contacts the microelectronic substrate to control the bond line thickness between the heat dissipation device and at least one microelectronic device and/or to control the bond line thickness of a sealant which may be used to attached the at least one projection to the microelectronic substrate.

20 Claims, 6 Drawing Sheets

(51) Int. Cl.
*H01L 23/498* (2006.01)
*H01L 23/00* (2006.01)
*H01L 23/31* (2006.01)

(52) U.S. Cl.
CPC ........ *H01L 23/49833* (2013.01); *H01L 24/17* (2013.01); *H01L 24/81* (2013.01)

(58) Field of Classification Search
USPC .................................................. 257/713, 704
See application file for complete search history.

(56) References Cited

U.S. PATENT DOCUMENTS

| | | | |
|---|---|---|---|
| 5,650,918 A | 7/1997 | Suzuki | |
| 5,789,810 A | 8/1998 | Gross et al. | |
| 5,956,576 A * | 9/1999 | Toy | H01L 23/10 |
| | | | 438/122 |
| 5,990,552 A | 11/1999 | Xie et al. | |
| 6,118,177 A | 9/2000 | Lischner et al. | |
| 6,218,730 B1 * | 4/2001 | Toy | H01L 23/42 |
| | | | 257/713 |
| 6,653,730 B2 | 11/2003 | Chrysler et al. | |
| 6,767,765 B2 * | 7/2004 | Chiu | H01L 23/04 |
| | | | 257/E23.101 |
| 7,221,570 B2 * | 5/2007 | Depew | H01L 23/433 |
| | | | 257/E23.09 |
| 8,174,112 B1 | 5/2012 | Karp et al. | |
| 2004/0075987 A1 | 4/2004 | Shim et al. | |
| 2004/0218354 A1 * | 11/2004 | Lee | H01L 23/42 |
| | | | 257/E23.087 |
| 2006/0043553 A1 * | 3/2006 | Yang | H01L 23/4093 |
| | | | 257/E23.086 |
| 2007/0222044 A1 * | 9/2007 | Otremba | H01L 23/49562 |
| | | | 257/E23.044 |
| 2008/0001277 A1 | 1/2008 | Wen et al. | |
| 2008/0012122 A1 | 1/2008 | Filoteo et al. | |
| 2008/0237840 A1 * | 10/2008 | Alcoe | H01L 23/42 |
| | | | 257/706 |
| 2011/0079902 A1 * | 4/2011 | Sakamoto | H01L 21/563 |
| | | | 257/788 |
| 2011/0096507 A1 | 4/2011 | Deram | |
| 2015/0001701 A1 * | 1/2015 | Li | H05K 5/03 |
| | | | 257/713 |
| 2015/0014836 A1 | 1/2015 | Blackshear et al. | |
| 2015/0357258 A1 | 12/2015 | Fitzgerald et al. | |

OTHER PUBLICATIONS

Final Office Action for U.S. Appl. No. 15/689,463, dated Jan. 23, 2020.
Non Final Office Action for U.S. Appl. No. 15/689,463, dated Jul. 18, 2018.
Non-Final Office Action for U.S. Appl. No. 15/689,463, dated Jul. 2, 2020.
Notice of Allowance for U.S. Appl. No. 15/689,463, dated Mar. 24, 2021.
Office Action for European Patent Application No. 18186198.0, dated Apr. 8, 2020.
Office Action for European Patent Application No. 18186198.0, dated Nov. 19, 2019.
Restriction Requirement for U.S. Appl. No. 15/689,463, dated Apr. 13, 2018.

* cited by examiner

HEAT SPREADER EDGE STANDOFFS FOR MANAGING BONDLINE THICKNESS IN MICROELECTRONIC PACKAGES

CLAIM FOR PRIORITY

This application is a Continuation of and claims priority to U.S. patent application Ser. No. 15/689,463, filed on Aug. 29, 2017 and titled "HEAT SPREADER STANDOFFS FOR MANAGING BONDLINE THICKNESS IN MICROELECTRONIC PACKAGES", which is incorporated by reference in its entirety.

TECHNICAL FIELD

Embodiments of the present description generally relate to the field of heat dissipation from a microelectronic device, and, more specifically, to a heat dissipation device which is attached to a microelectronic substrate for the removal of heat from one or more microelectronic devices.

BACKGROUND ART

The microelectronic industry is continually striving to produce ever faster and smaller microelectronic devices for use in various mobile electronic products. As these goals are achieved, the density of power consumption of components within the microelectronic devices has increased, which, in turn, increases the average junction temperature of the microelectronic device. If the temperature of the microelectronic device becomes too high, the integrated circuits within the microelectronic device may be damaged or destroyed. Thus, heat dissipation devices are used to remove heat from the microelectronic devices in a microelectronic package. For example, at least one microelectronic device may be mounted to a substrate and the heat dissipation device may be attached to the substrate and extend over the microelectronic device(s) to form the microelectronic package. The distance between the microelectronic device(s) and the heat dissipation device is known as the bond line thickness, and a thermal interface material is generally disposed between the microelectronic device(s) and the heat dissipation device to form thermal contact therebetween. In general, the thinnest bond line thicknesses maximize heat removal. However, multiple microelectronic devices being thermally managed by a single heat dissipation device may create various issues.

One issue is that multiple microelectronic devices can result in the heat dissipation device bottoming out or contacting one of the microelectronic devices, which may cause the heat dissipation device to tilt and lead to sealant delamination and microelectronic device cracking, as will be understood to those skilled in the art.

Another issue with multiple microelectronic devices is that it is not generally predicable upon which microelectronic device the heat dissipation device will bottom out. This coupled with the variability in the direct device attach process may cause deformation of the microelectronic package also leading to unpredictable bond lines. This may lead to unpredictable thermal performance and may also lead to degradation of the thermal interface material.

Thus, there is a need to develop heat dissipation device configurations to address the various issues with regard to multiple microelectronic devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description relate to a microelectronic package fabricated to include a microelectronic substrate, at least one microelectronic device attached to the microelectronic substrate, a heat dissipation device in thermal contact with the at least one microelectronic device and having at least one projection attached to the microelectronic substrate, and at least one standoff extending from the at least one projection, wherein the at least one standoff contacts the microelectronic substrate to control the bond line thickness between the heat dissipation device and at least one microelectronic device and/or to control the bond line thickness of a sealant which may be used to attached the at least one projection to the microelectronic substrate.

Figure 1:
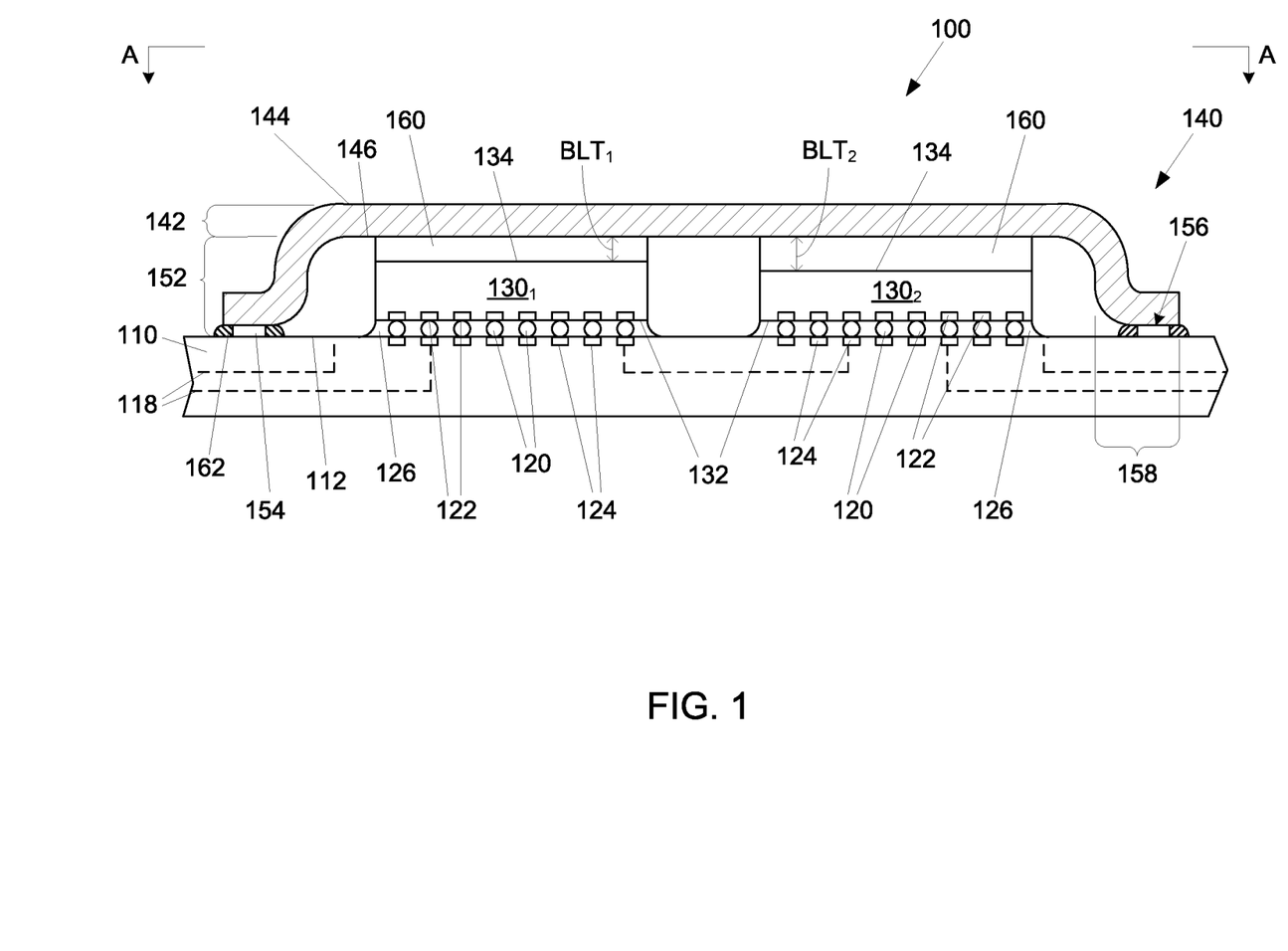
FIG. 1 illustrates a side cross-sectional view of a microelectronic package including microelectronic devices attached to the microelectronic substrate with a heat dissipation device attached to the microelectronic substrate spanning the microelectronic devices, wherein a standoff is positioned between a projection of the heat dissipation device and the microelectronic substrate, according to one embodiment of the present description.

As shown in FIG. 1, a microelectronic package 100 may be formed by first providing or forming a microelectronic substrate 110, such as a printed circuit board, motherboard, or the like. At least one microelectronic device (shown as a first microelectronic device 130$_1$ and a second microelectronic device 130$_2$), such as a microprocessor, a multichip package, a chipset, a graphics device, a wireless device, a memory device, an application specific integrated circuit device, and the like, may be attached to a first surface 112 of the microelectronic substrate 110 with a plurality of interconnects 120. The device-to-substrate interconnects 120, such as soldered interconnects, may extend between bond pads 122 formed in or on an active surface 132 of each of the microelectronic devices 130$_1$ and 130$_2$, and substantially mirror-image bond pads 124 in or on the microelectronic substrate first surface 112. An underfill material 126, such as an epoxy material, may be disposed between the microelectronic device active surface 132 and the microelectronic substrate first surface 112, and surrounding the device-to-substrate interconnects 120. As will be understood to those skilled in the art, the underfill material 126 may be dispensed between the microelectronic device active surfaces 132 and the microelectronic substrate first surface 112 as a viscosity liquid and then hardened with a curing process. The underfill material 126 may also be a molded underfill material, as known in the art. The underfill material 126 may provide structural integrity and may prevent contamination, as will be understood those skilled in the art.

As further shown in FIG. 1, the microelectronic substrate 110 may provide electrical communication routes (illustrated as dashed lines 118) between the microelectronic devices 130$_1$ and 130$_2$, and external components (not shown). As will be understood to those skilled in the art, the microelectronic device bond pads 122 may be in electrical communication with integrated circuitry (not shown) within each of the microelectronic devices 130$_1$ and 130$_2$.

As yet further shown in FIG. 1, a heat dissipation device 140 may be attached to the microelectronic substrate 110. The heat dissipation device 140 may include a planar portion 142 having a first surface 144 and an opposing second surface 146, and may have at least one projection 152 extending from the planar portion second surface 146. The heat dissipation device projection(s) 152 may be attached to the microelectronic substrate first surface 112 such that the planar portion second surface 146 spans, but does not necessarily directly contact back surfaces 134 (opposing each of the microelectronic device active surfaces 132) of each of the microelectronic devices 130$_1$ and 130$_2$, and a thermal interface material 160 may be disposed between the planar portion second surface 146 of the heat dissipation device 140 and the back surfaces 134 of each of the microelectronic devices 130$_1$ and 130$_2$.

The heat dissipation device projection(s) 152 include at least one edge standoff 154 extending from an attachment surface 156 of the heat dissipation device projection(s) 152. In one embodiment, the heat dissipation device projection attachment surface 156 may be substantially parallel to the microelectronic substrate first surface 112. In another embodiment, the heat dissipation device projection(s) 152 may include a lip portion 158, wherein the heat dissipation device projection attachment surface 156 is on the heat dissipation device projection lip portion 158. The heat dissipation device projection(s) 152 may be attached to the microelectronic substrate 110 by any appropriate means, including but not limited to a sealant 162, such as an epoxy, disposed between the attachment surface 156 of the heat dissipation device projection(s) 152 and the microelectronic substrate first surface 112.

Figure 2:
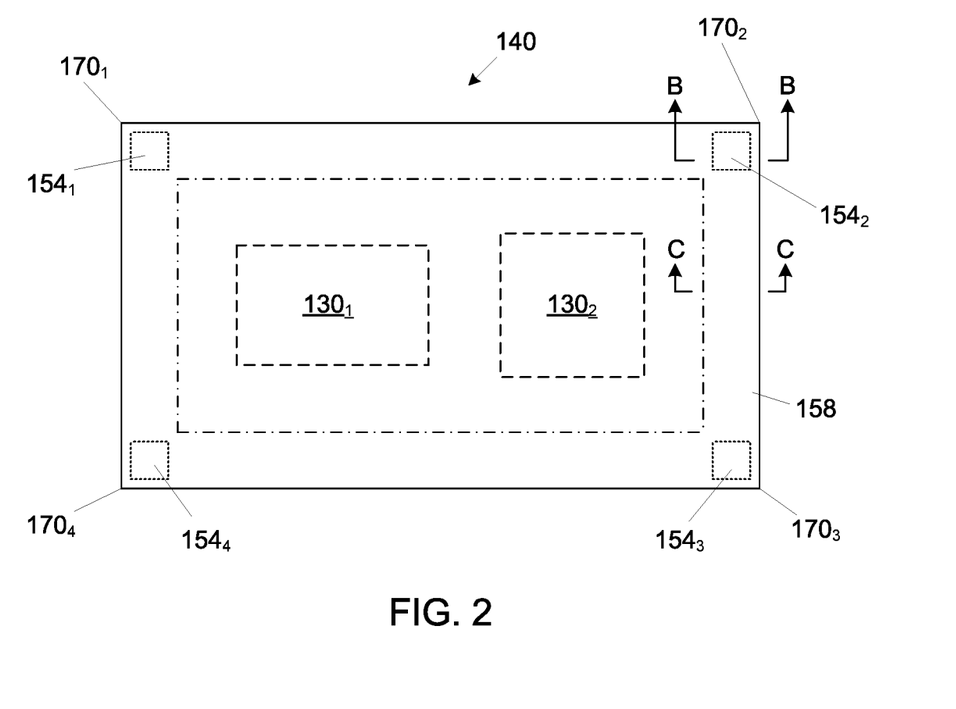
FIG. 2 illustrates a top plan view along line A-A of FIG. 1, according to one embodiment of the present description.

In one embodiment shown in FIG. 2, the edge standoffs (illustrated as elements 154$_1$, 154$_2$, 154$_3$, and 154$_4$ in short dash shadow lines) may be evenly distributed in the corners 170$_1$, 170$_2$, 170$_3$, and 170$_4$ of the heat dissipation device 140, respectively. Thus, the edge standoffs 154$_1$, 154$_2$, 154$_3$, and 154$_4$ may act like stilts, such that they bottom out and reference to the microelectronic substrate 110 (see FIG. 1), which may result in the thermal interface material bond line thickness BLT$_1$, BLT$_2$ (see FIG. 1) being consistent between separate microelectronic packages. For the sake of clarity, the microelectronic devices 130$_1$ and 130$_2$ are illustrated in long dash shadow line and the heat dissipation device projections 152 is demarked in a dot-dash shadow line.

Figure 3:
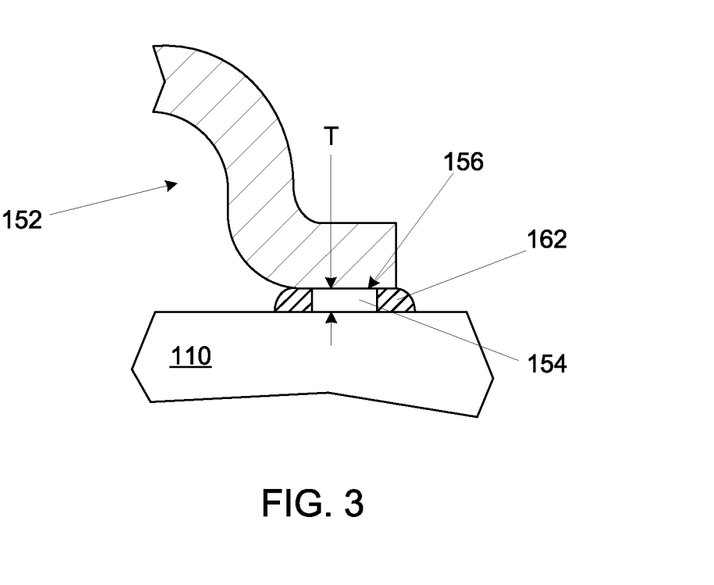
FIG. 3 illustrates a side cross-sectional view along line B-B of FIG. 2, according to one embodiment of the present description.
Figure 4:
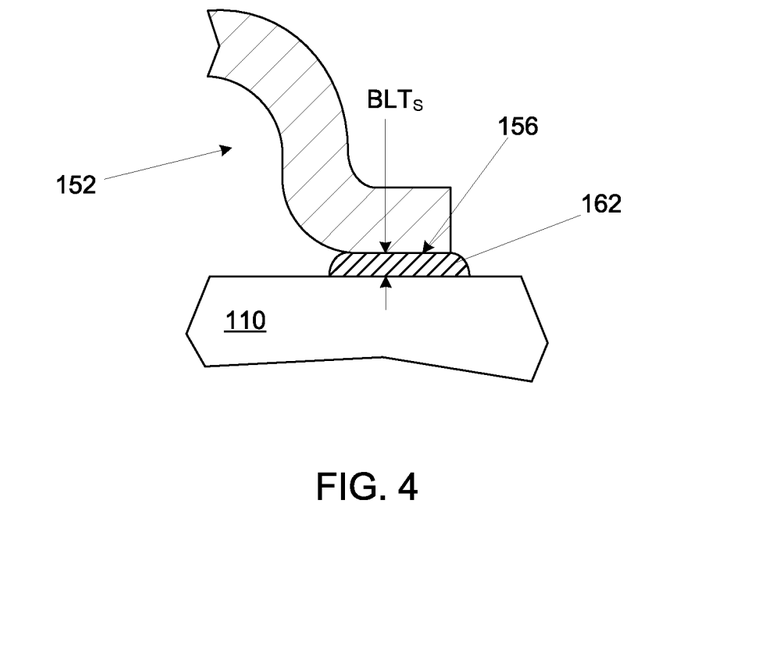
FIG. 4 illustrates a side cross-sectional view along line C-C of FIG. 2, according to one embodiment of the present description.

As shown in FIG. 3, the standoffs 154 may have a desired thickness T, and, since the standoffs bottom out the microelectronic substrate 110, the sealant 162 may have a uniform bond line thickness BLTs, as shown in FIG. 4, between the heat dissipation device projection(s) 152 and the microelectronic substrate 110 and extending between adjacent edge standoffs 154$_1$, 154$_2$, 154$_3$, and 154$_4$ (see FIG. 2). This uniformity in the sealant bond line thickness BLTs may improve the reliability the microelectronic package 100 (see FIG. 1), as will be understood to those skilled in the art.

Figure 5:
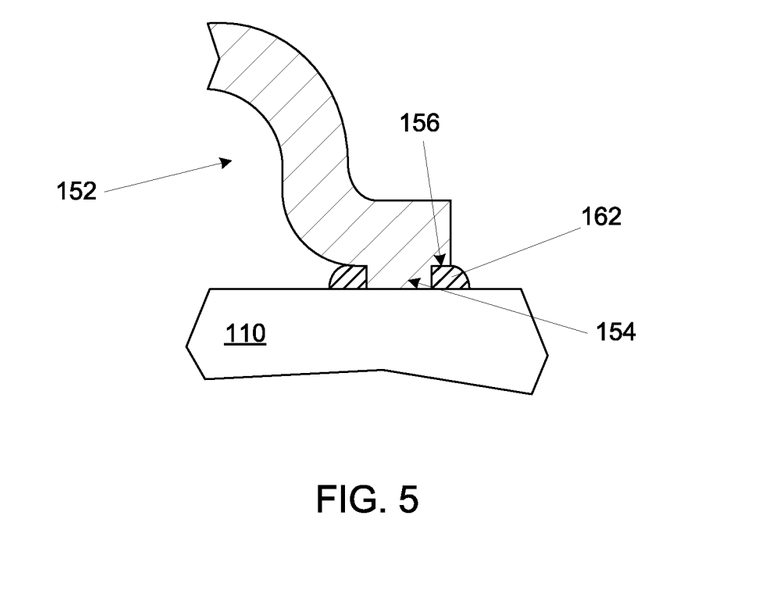
FIG. 5 illustrates a side cross-sectional view of a projection of a heat dissipation device, according to various embodiments of the present description.

FIGS. 1 and 3 illustrate the edge standoffs 154 as separate structures which are attached to the heat dissipation device projection(s) 152. However, the embodiments of the present description are not so limited. As shown in FIG. 5, the edge standoffs 154 may not be separate structures, but rather may be a single continuous material with the rest of the heat dissipation device 140. The heat dissipation device 140 may be formed from any appropriate thermally conductive material, including, but not limited to copper, aluminum, and the like. In one embodiment, the heat dissipation device 140 may be formed from a stamping, a molding, or a skiving process. When the edge offset(s) 154 are separate structures from the heat dissipation device 140, they may be made of any substantially rigid material, including but not limited to stainless steel, aluminum, copper, ceramics, and the like.

Figure 6:
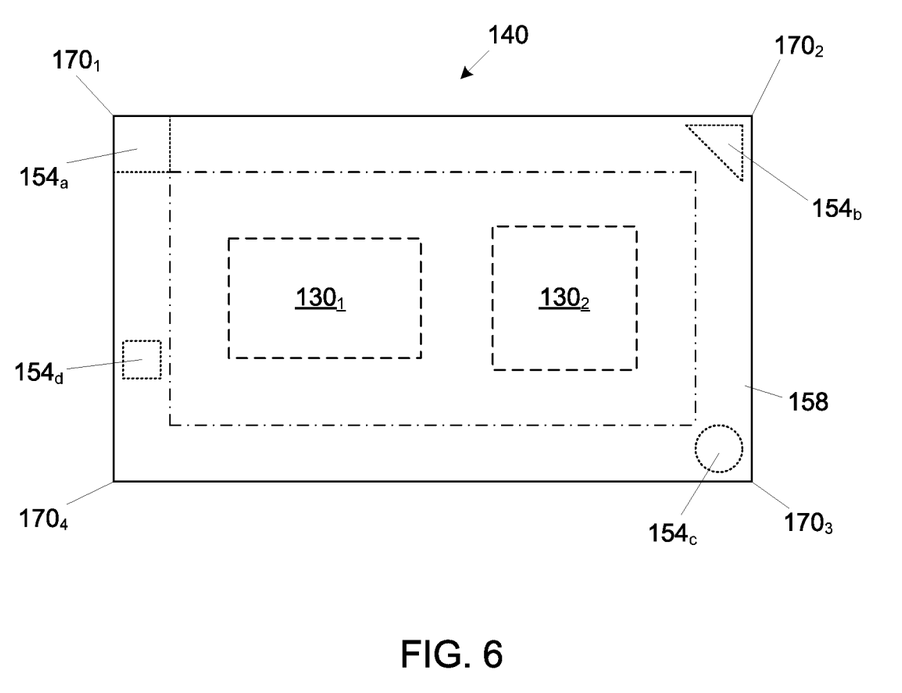
FIG. 6 illustrates top plan view of a heat dissipation device showing various configurations of standoffs, according to various embodiments of the present description.

Although the edge standoffs $154_1$, $154_2$, $154_3$, and $154_4$ shown in FIG. 2 are substantially square and are sized smaller than the heat dissipation device projection lip portion 158, the embodiments of the present description are not so limited. As shown in FIG. 6, the edge standoff 154a may be sized to be cover the heat dissipation device projection lip portion 158 in at least one of the heat dissipation device corners $170_1$. Furthermore, the edge standoff(s) can have any appropriate shape. For example, as also shown in FIG. 6, the edge standoff(s) can have any appropriate cross-section, including, but limited to triangular (element 154b), circular (element 154c), or to the like. It is understood that the embodiments illustrated in FIGS. 1-6 are merely exemplary and that the heat dissipation device projection(s) 152 and the edge standoffs 154, $154_{1-4}$, and 154a-d may have any appropriate shape and configuration.

As further shown in FIG. 6, the standoff(s), such as element 154d, need not be positioned in a corner, such as corner $170_4$, as some microelectronic packages may benefit from having the stand-off(s) 154d in other locations along the heat dissipation device projection lip portion 156. Although the illustrated embodiments of the present detailed description show the use of four edge standoff(s), the embodiments are not so limited. However, it may be advantageous to have a minimum of three edge standoff(s) to create a level plane for the attachment of the heat dissipation device 140 to the microelectronic substrate 110. It is further understood that it may be advantageous to place the standoff(s) in areas that would impart low stress on the sealant 162, as will be understood to those skilled in the art.

The embodiments of FIGS. 1-6 illustrate a fairly simple heat dissipation device design. However, the concepts of the present detailed description can also be beneficial in complex lids, as will be understood to those skilled in the art.

Figure 7:
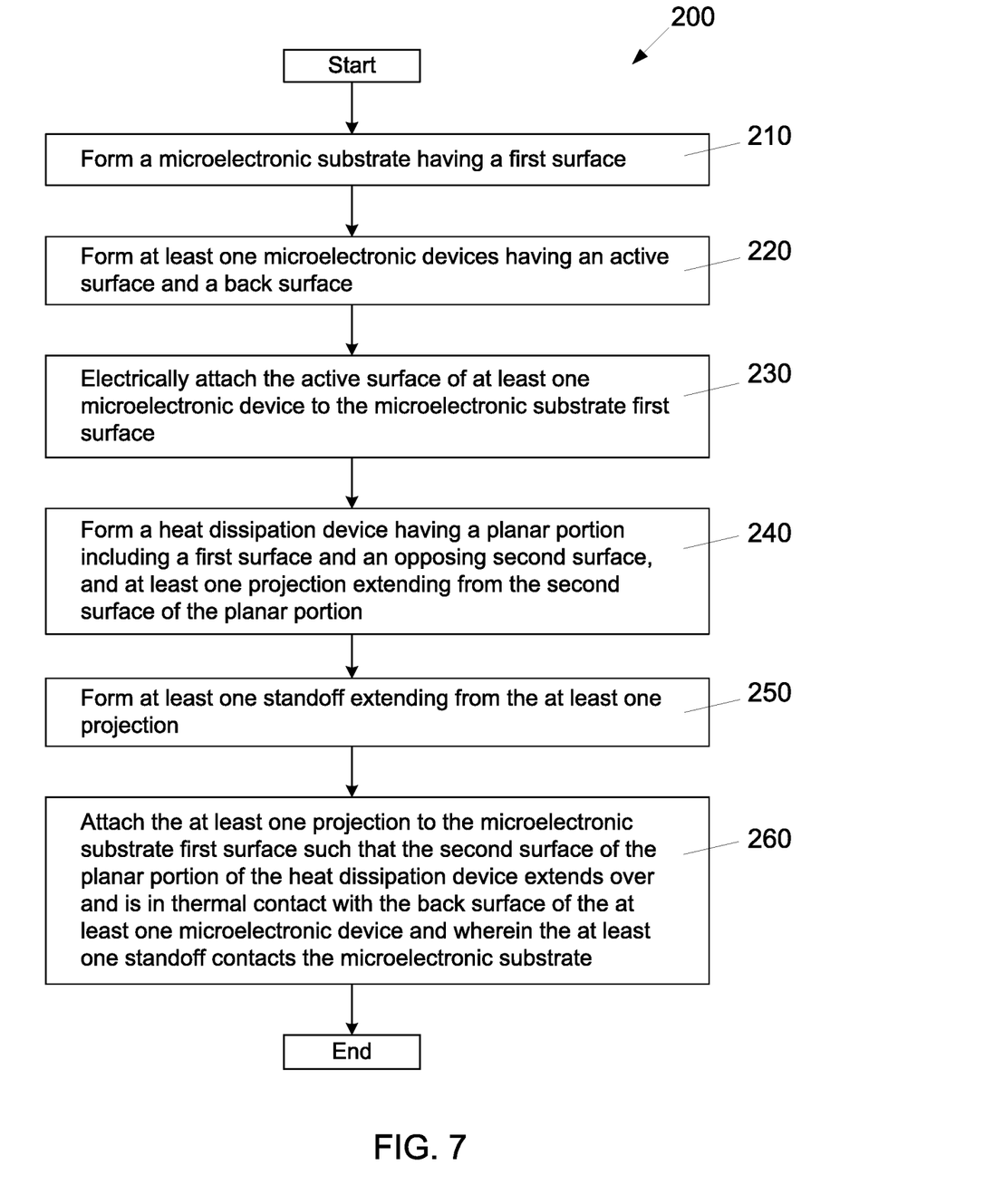
FIG. 7 is a flow chart of a process of fabricating a microelectronic package including a heat dissipation device having standoffs, according to an embodiment of the present description.

FIG. 7 is a flow chart of a process 200 of fabricating a microelectronic package according to the various embodiments of the present description. As set forth in block 210, a microelectronic substrate having a first surface may be formed. At least one microelectronic device having an active surface and a back surface may be formed, as set forth in block 220. As set forth in block 230, the active surface of the at least one microelectronic devices may be electrically attached to the microelectronic substrate first surface. A heat dissipation device may be formed having a planar portion including a first surface and an opposing second surface, and at least one projection extending from the second surface of the portion, as set forth in block 240. As set forth in block 250, at least one standoff may be formed to extend from the at least one projection. The at least one projection may be attached to the microelectronic substrate first surface such that the second surface of the planar portion of the heat dissipation device extends over the back surface of the at least one microelectronic devices and wherein the at least one standoff contacts the microelectronic substrate, as set forth in block 260.

Figure 8:
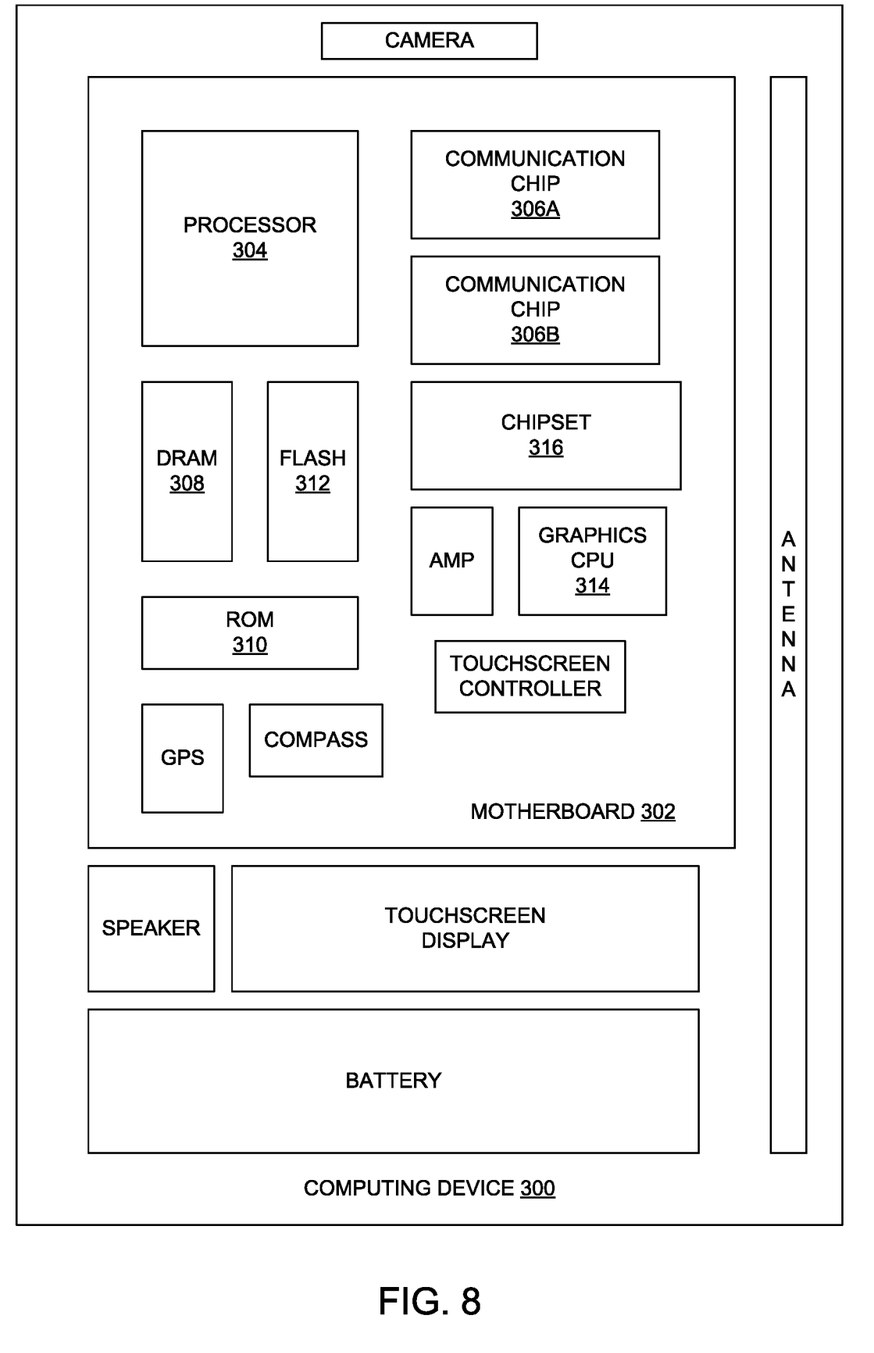
FIG. 8 illustrates an electronic system, according to one embodiment of the present description.

FIG. 8 illustrates a computing device 300 in accordance with one implementation of the present description. The computing device 300 may house a board 302. The board 302 may include a number of microelectronic components attached thereto, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touch-screen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others The term "processor" may refer to any device or portion of a device that processes electronic data from registers and/or memory to transform that electronic data into other electronic data that may be stored in registers and/or memory.

Any of the microelectronic components within the computing device 300 may include a microelectronic package including at least one microelectronic device attached to a microelectronic substrate, a heat dissipation device in thermal contact with the at least one microelectronic device and having at least one projection attached to the microelectronic substrate, and at least one standoff extending from the at least one projection, wherein the at least one standoff contacts the microelectronic substrate to control the bond line thickness between the heat dissipation device and at least one microelectronic device and/or to control the bond line thickness of a sealant which may be used to attached the at least one projection to the microelectronic substrate.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other microelectronic device and assembly applications, as will be understood to those skilled in the art.

The following examples pertain to further embodiments, wherein Example 1 is a microelectronic package comprising a microelectronic substrate having a first surface; at least one microelectronic device having an active surface and a back surface, wherein the microelectronic device active surface is electrically attached to the microelectronic substrate first surface; a heat dissipation device, including a planar portion having a first surface and an opposing second surface, and at least one projection extending from the second surface of planar portion, wherein the at least one projection is attached to the microelectronic substrate and wherein the second surface of the planar portion of the heat dissipation device is in thermal contact with the back surface of at least one microelectronic device; and at least one standoff extending from the at least one projection, wherein the at least one standoff contacts the microelectronic substrate.

In Example 2, the subject matter of Example 1 can optionally include the at least one standoff comprising a structure separate from the heat dissipation device.

In Example 3, the subject matter of Example 1 can optionally include the at least one standoff and the heat dissipation device comprising a single continuous structure.

In Example 4, the subject matter of any of Examples 1 to 3 can optionally include the at least one heat dissipation device projection including an attachment surface, wherein the at least one standoff extends from the attachment surface.

In Example 5, the subject matter of Example 4 can optionally include the attachment surface being substantially parallel to the microelectronic substrate first surface.

In Example 6, the subject matter of any of Examples 1 to 3 can optionally include the at least one heat dissipation device projection including a lip portion having an attachment surface, wherein the at least one standoff extends from the attachment surface.

In Example 7, the subject matter of Example 6 can optionally include the attachment surface being substantially parallel to the microelectronic substrate first surface.

In Example 8, the subject matter of any of Examples 1 to 3 can optionally include a sealant disposed between the microelectronic substrate and the at least one projection.

In Example 9, the subject matter of any of Examples 1 to 3 can optionally include a thermal interface material disposed between the second surface of the planar portion of the heat dissipation device and the back surface of the at least one microelectronic device.

In Example 10, the subject matter of any of Examples 1 to 3 can optionally include an underfill material disposed between the microelectronic device active surface and the microelectronic substrate first surface.

The following examples pertain to further embodiments, wherein Example 10 is a method of fabricating a microelectronic package, comprising forming a microelectronic substrate having a first surface; forming at least one microelectronic device having an active surface and a back surface; electrically attaching the active surface of at least one microelectronic device to the microelectronic substrate first surface; forming a heat dissipation device having a planar portion including a first surface and an opposing second surface, and at least one projection extending from the second surface of the planar portion; forming at least one standoff extending from the at least one projection; and attaching the at least one projection to the microelectronic substrate first surface such that the second surface of the planar portion of the heat dissipation device extends over the back surface of at least one microelectronic device and wherein the at least one standoff contacts the microelectronic substrate.

In Example 12, the subject matter of Example 11 can optionally include forming the at least one standoff comprising forming a structure separate from the heat dissipation device.

In Example 13, the subject matter of Example 11 can optionally include forming the at least one standoff and the heat dissipation device comprising forming a single continuous structure.

In Example 14, the subject matter of any of Examples 11 to 13 can optionally include forming the at least one heat dissipation device projection including forming an attachment surface, wherein the at least one standoff extends from the attachment surface.

In Example 15, the subject matter of Example 14 can optionally include forming the attachment surface being substantially parallel to the microelectronic substrate first surface.

In Example 16, the subject matter of any of Examples 11 to 13 can optionally include forming the at least one heat dissipation device projection including forming a lip portion having an attachment surface, wherein the at least one standoff extends from the attachment surface.

In Example 17, the subject matter of Example 16 can optionally include forming the attachment surface being substantially parallel to the microelectronic substrate first surface.

In Example 18, the subject matter of any of Examples 11 to 13 can optionally include disposing a sealant between the microelectronic substrate and the at least one projection.

In Example 19, the subject matter of any of Examples 11 to 13 can optionally include disposing a thermal interface material between the second surface of the planar portion of the heat dissipation device and the back surface of the at least one microelectronic device.

In Example 20, the subject matter of any of Examples 11 to 13 can optionally include disposing an underfill material between the microelectronic device active surface and the microelectronic substrate first surface.

The following examples pertain to further embodiments, wherein Example 21 is an electronic system, comprising a board; and a microelectronic package attached to the board, wherein the microelectronic package includes a microelectronic substrate having a first surface; at least one microelectronic device having an active surface and a back surface, wherein the microelectronic device active surface of the at least one microelectronic device is electrically attached to the microelectronic substrate first surface; a heat dissipation device, including a planar portion having a first surface and an opposing second surface, and at least one projection extending from the second surface of planar portion, wherein the at least one projection is attached to the microelectronic substrate and wherein the second surface of the planar portion of the heat dissipation device is in thermal contact with the back surface of at least one microelectronic device; and at least one standoff extending from the at least one projection, wherein the at least on standoff contacts the microelectronic substrate.

In Example 22, the subject matter of Example 21 can optionally include the at least one standoff comprising a structure separate from the heat dissipation device.

In Example 23, the subject matter of Example 21 can optionally include the at least one standoff and the heat dissipation device comprising a single continuous structure.

In Example 24, the subject matter of any of Examples 21 to 23 can optionally include the at least one heat dissipation device projection including an attachment surface, wherein the at least one standoff extends from the attachment surface.

In Example 25, the subject matter of Example 24 can optionally include the attachment surface being substantially parallel to the microelectronic substrate first surface.

In Example 26, the subject matter of any of Examples 21 to 23 can optionally include the at least one heat dissipation device projection including a lip portion having an attachment surface, wherein the at least one standoff extends from the attachment surface.

In Example 27, the subject matter of Example 26 can optionally include the attachment surface being substantially parallel to the microelectronic substrate first surface.

In Example 28, the subject matter of any of Examples 21 to 23 can optionally include a sealant disposed between the microelectronic substrate and the at least one projection.

In Example 29, the subject matter of any of Examples 21 to 23 can optionally include a thermal interface material disposed between the second surface of the planar portion of the heat dissipation device and the back surface of the at least one microelectronic device.

In Example 30, the subject matter of any of Examples 21 to 23 can optionally include an underfill material disposed between the microelectronic device active surface and the microelectronic substrate first surface.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package, comprising:
   a microelectronic substrate having a first surface;
   at least two microelectronic devices each having an active surface and a back surface, wherein the active surface of each of the microelectronic devices is electrically attached to the first surface of the microelectronic substrate; and
   a heat dissipation device, wherein the heat dissipation device comprises:
      a planar portion having a first surface and an opposing second surface, wherein the second surface of the planar portion of the heat dissipation device is thermally coupled to the back surface of each of the microelectronic devices, a first of the microelectronic devices has a first bond line thickness between its back surface and the second surface of the planar portion, and a second of the microelectronic devices has a second bond line thickness between its back surface and the second surface of the planar portion that is less than the first bond line thickness;
      at least one projection extending from the second surface of planar portion, wherein the at least one projection comprises a lip comprising an attachment surface and a second surface opposite the attachment surface, the second surface of the lip vertically between the second surface of the planar portion and the attachment surface, wherein the lip is attached to the first surface of the microelectronic substrate with a sealant contacting the attachment surface and contacting the first surface of the microelectronic substrate; and
      at least one standoff extending from the attachment surface of the lip, wherein the at least one standoff contacts the first surface of the microelectronic substrate and contacts the sealant.

2. The microelectronic package of claim 1, wherein the at least one standoff comprises a structure separate from the heat dissipation device.

3. The microelectronic package of claim 1, wherein the at least one standoff and the heat dissipation device comprise a single continuous structure.

4. The microelectronic package of claim 1, wherein the attachment surface is substantially parallel to the first surface of the microelectronic substrate.

5. The microelectronic package of claim 1, wherein the heat dissipation device comprises a projection at each corner of the microelectronic substrate.

6. The microelectronic package of claim 5, wherein a first of the projections comprises a standoff that is a single continuous structure with the heat dissipation device and a second of the projections comprises a standoff that is a structure separate from the heat dissipation device.

7. The microelectronic package of claim 1, further comprising a thermal interface material between the second surface of the planar portion of the heat dissipation device and the back surface of each of the microelectronic devices.

8. An electronic system, comprising:
   a board; and
   a microelectronic package attached to the board, wherein the microelectronic package comprises:
      a microelectronic substrate having a first surface;
      at least two microelectronic devices each having an active surface and a back surface, wherein the active surface of each of the microelectronic devices is electrically attached to the first surface of the microelectronic substrate; and
      a heat dissipation device, wherein the heat dissipation device comprises:
         a planar portion having a first surface and an opposing second surface, wherein the second surface of the planar portion of the heat dissipation device is thermally coupled to the back surface of each of the microelectronic devices, a first of the microelectronic devices has a first bond line thickness between its back surface and the second surface of the planar portion, and a second of the microelectronic devices has a second bond line thickness between its back surface and the second surface of the planar portion that is less than the first bond line thickness;
         at least one projection extending from the second surface of planar portion, wherein the at least one projection comprises a lip comprising an attachment surface and a second surface opposite the attachment surface, the second surface of the lip vertically between the second surface of the planar portion and the attachment surface, wherein the lip is attached to the first surface of the microelectronic substrate with a sealant contacting the attachment surface and contacting the first surface of the microelectronic substrate; and
         at least one standoff extending from the attachment surface of the lip, wherein the at least one standoff contacts the first surface of the microelectronic substrate and contacts the sealant.

9. The electronic system of claim 8, wherein the at least one standoff comprises a structure separate from the heat dissipation device.

10. The electronic system of claim 8, wherein the at least one standoff and the heat dissipation device comprise a single continuous structure.

11. The electronic system of claim 8, wherein the attachment surface is substantially parallel to the first surface of the microelectronic substrate.

12. The electronic system of claim 8, wherein the heat dissipation device comprises a projection at each corner of the microelectronic substrate.

13. The electronic system of claim 12, wherein a first of the projections comprises a standoff that is a single continuous structure with the heat dissipation device and a second of the projections comprises a standoff that is a structure separate from the heat dissipation device.

14. The electronic system of claim 8, further comprising a thermal interface material between the second surface of the planar portion of the heat dissipation device and the back surface of each of the microelectronic devices.

15. A method of fabricating a microelectronic package, comprising:
   forming a microelectronic substrate having a first surface;
   forming at least two microelectronic devices each having an active surface and a back surface;
   electrically attaching the active surface of each of the microelectronic devices to the microelectronic substrate first surface;
   forming a heat dissipation device comprising:
      a planar portion including a first surface and an opposing second surface,
      at least one projection extending from the second surface of the planar portion, wherein the at least one projection comprises a lip comprising an attachment surface and a second surface opposite the attachment surface;
      at least one standoff extending from the attachment surface of the lip; and
   attaching the lip to the first surface of the microelectronic substrate with a sealant contacting the attachment surface of the lip and contacting the first surface of the microelectronic substrate, wherein the second surface of the planar portion of the heat dissipation device extends over and is thermally coupled with the back surface of each of the one microelectronic devices, wherein the at least one standoff contacts the first surface of the microelectronic substrate and contacts the sealant, wherein a first of the microelectronic devices has a first bond line thickness between its back surface and the second surface of the planar portion, and a second of the microelectronic devices has a second bond line thickness between its back surface and the second surface of the planar portion that is less than the first bond line thickness, and wherein the second surface of the lip is vertically between the second surface of the planar portion and the attachment surface.

16. The method of claim 15, wherein the at least one standoff comprises a structure separate from the heat dissipation device.

17. The method of claim 15, wherein the at least one standoff and the heat dissipation device comprise a single continuous structure.

18. The method of claim 15, wherein the attachment surface is substantially parallel to the microelectronic substrate first surface.

19. The method of claim 15, wherein the heat dissipation device comprises a projection at each corner of the microelectronic substrate.

20. The method of claim 19, wherein a first of the projections comprises a standoff that is a single continuous structure with the heat dissipation device and a second of the projections comprises a standoff that is a structure separate from the heat dissipation device.

* * * * *